United States Patent
Imanishi

(10) Patent No.: US 8,355,218 B2
(45) Date of Patent: Jan. 15, 2013

(54) OPTICAL ELEMENT POSITION ADJUSTING MECHANISM AND OPTICAL ELEMENT POSITION ADJUSTING METHOD, EXPOSURE APPARATUS USING SAME, AND DEVICE MANUFACTURING METHOD

(75) Inventor: Kenichi Imanishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 12/783,341

(22) Filed: May 19, 2010

(65) Prior Publication Data

US 2010/0296182 A1  Nov. 25, 2010

(30) Foreign Application Priority Data

May 20, 2009 (JP) .................................. 2009-121891

(51) Int. Cl.
G02B 7/02 (2006.01)
G02B 15/22 (2006.01)
(52) U.S. Cl. ........................................ 359/822; 359/704
(58) Field of Classification Search .................. 359/818, 359/819, 822, 703–704
See application file for complete search history.

(56) References Cited

U.S. PATENT DOCUMENTS

2006/0139775 A1* 6/2006 Shibazaki ..................... 359/819

FOREIGN PATENT DOCUMENTS

JP  2008-242448 A  10/2008

* cited by examiner

*Primary Examiner* — Alicia M Harrington
(74) *Attorney, Agent, or Firm* — Canon U.S.A., Inc. IP Division

(57) ABSTRACT

The optical element position adjusting mechanism includes a holding member for holding an outer periphery of an optical element, a fixing portion for pivotally fixing the holding member to adjust the position of the optical element, a clamping portion capable of fixing or releasing the holding member against the fixing portion, a driving section for driving the holding member fixed to the fixing portion by the clamping portion in a pivot direction, and a flexure that is interposed between the clamping portion and the holding member and elastically deforms to guide the holding member driven by the driving section in the pivot direction about the clamping portion. The holding member positioned by the pivot is released from the fixing portion by the clamping portion to restore the flexure to the state prior to being elastically deformed, whereby it is again fixed to the fixing portion by the clamping portion.

9 Claims, 6 Drawing Sheets

OPTICAL ELEMENT POSITION ADJUSTING MECHANISM AND OPTICAL ELEMENT POSITION ADJUSTING METHOD, EXPOSURE APPARATUS USING SAME, AND DEVICE MANUFACTURING METHOD

BACKGROUND OF THE INVENTION

1. Field of the Invention

The present invention relates to an optical element position adjusting mechanism and an optical element position adjusting method, an exposure apparatus using the same, and a device manufacturing method.

2. Description of the Related Art

In an exposure apparatus, a superposition of patterns may necessitate a mechanism for adjusting the position of an optical element with high accuracy. As a mechanism for adjusting the position of an optical element, measurements by a sensor and a feedback control using these measurement results have been conventionally employed in order to achieve highly accurate positioning and at the same time to achieve high position stability. Japanese Patent Laid-Open No. 2008-242448 discloses an exposure apparatus having a mechanism which employs in combination a feedback control using a sensor and an actuator, and a flexure guide. In this case, an improvement is made such that the mechanism becomes less prone to drive in a direction other than the driving direction with the aid of the flexure guide, whereby more highly accurate positioning can be achieved.

However, the technique disclosed in Japanese Patent Laid-Open No. 2008-242448 requires a permanent inclusion of a sensor, and thus, the degree of freedom in disposing a sensor may be undesirably limited depending on the wiring of the sensor. Likewise, an electrical system for performing feedback control may also be required, whereby the overall apparatus to which an optical element position adjusting mechanism is mounted, and the overall size of the exposure apparatus may thereby become enlarged. Furthermore, maintenance may become difficult due to wiring.

SUMMARY OF THE INVENTION

In consideration of the above-mentioned facts, the present invention provides a self-supporting optical element position adjusting mechanism that is capable of performing highly accurate positioning of an optical element without using a sensor and has high position stability, and an optical element position adjusting method, an exposure apparatus using the same; and a device manufacturing method.

According to an aspect of the present invention, an optical element position adjusting mechanism is provided which includes a holding member for holding an outer periphery of an optical element, a fixing portion for pivotally fixing the holding member in order to adjust a position of the optical element, a clamping portion capable of fixing or releasing the holding member with respect to the fixing portion, a driving section for driving the holding member fixed to the fixing portion by the clamping portion in a pivot direction, and a flexure that is interposed between the clamping portion and the holding member and elastically deforms to guide the holding member driven by the driving section in the pivot direction about the clamping portion, wherein the holding member of the optical element, which has been positioned by the pivot, is released from the fixing portion by the clamping portion so as to restore the flexure to the state prior to being elastically deformed, whereby the holding member is again fixed to the fixing portion by the clamping portion.

According to the present invention, both highly accurate positioning using a flexure guide and position stability by adjusting the frictional force of a clamp may be achieved without using a sensor.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings. A description will be given to illustrate a specific configuration, operation, and the like of the optical element position adjusting mechanism, but these may be changed appropriately. As an apparatus to which the optical element position adjusting mechanism is mounted, explanation will be given of an exemplary exposure apparatus. However, this mounting apparatus is not intended to be limiting to an exposure apparatus.

(Exposure Apparatus)

Figure 1:
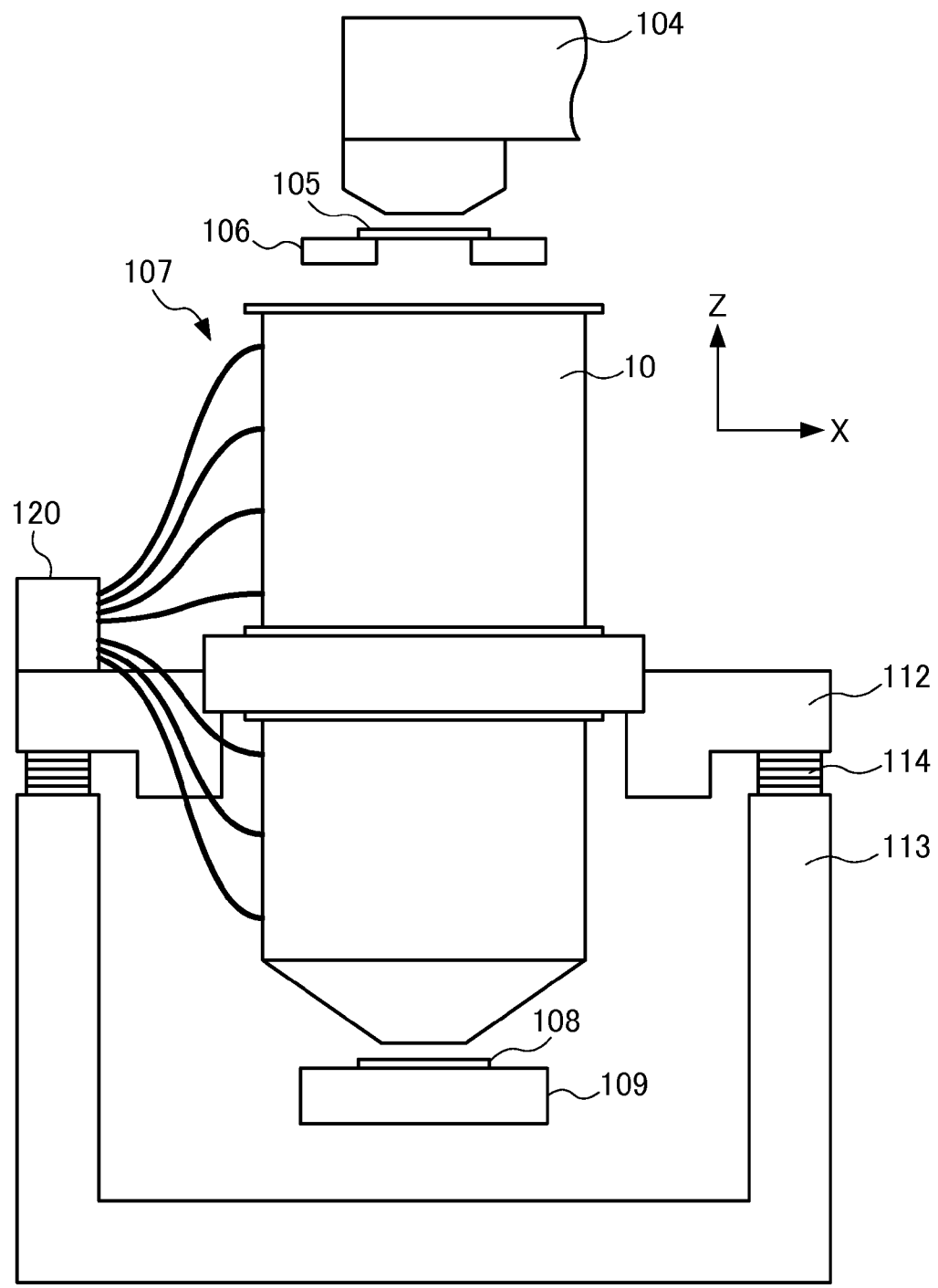
FIG. 1 is a schematic diagram illustrating a configuration of an exposure apparatus including the optical element position adjusting mechanism of the present invention.

FIG. 1 is a schematic diagram illustrating an exposure apparatus to which the optical element position adjusting mechanism of the present invention is applied. As shown in FIG. 1, the exposure apparatus includes an illumination unit 104 that illuminates slit light onto a reticle (original) 105, and a reticle stage 106 that mounts and moves the reticle 105. The exposure apparatus further includes a projection optical system 107 that projects the pattern of the reticle 105 onto a wafer (substrate) 108, and a wafer stage 109 on which the wafer 108 is mounted and moved. The projection optical system 107 includes an optical lens barrel 10 which is arranged in the optical axis direction (the Z axis direction in FIG. 1). The optical lens barrel 10 serves as a fixing portion to which an optical element holding member to be described below is pivotally fixed. The projection optical system 107 is supported by a lens barrel plate 112 that serves as a support, and the lens barrel plate 112 is supported by a body 113 disposed on a floor via a vibration isolation mechanism 114. The vibration isolation mechanism 114 may suppress the transmission of vibration from the floor to the projection optical system 107. With the aforementioned arrangement, the reticle stage 106 and the wafer stage 109 are scanning-driven synchronously, when an exposure is started. The wafer stage 109 has a mechanism that moves in the optical axis direction, and focus adjustment may be performed thereby during exposure.

First Embodiment

Figure 2A:
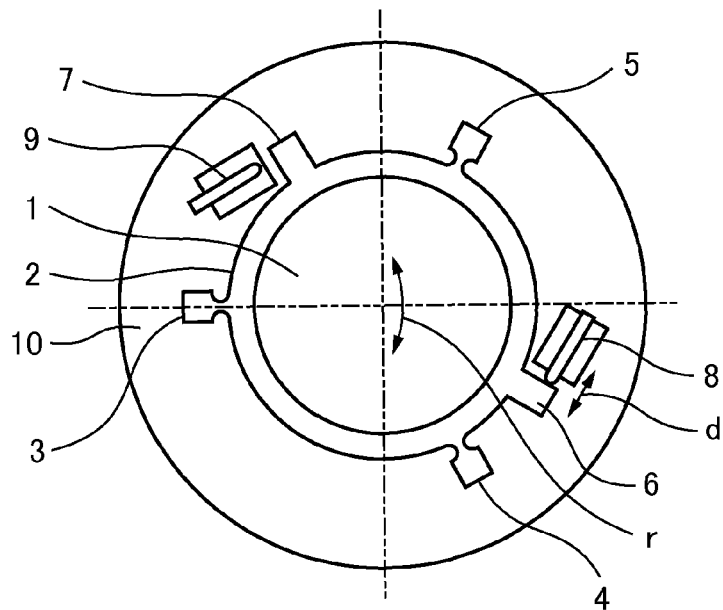
FIG. 2A is a top plan view illustrating an optical element position adjusting mechanism according to a first embodiment of the present invention.

FIG. 2A is a top plan view illustrating an optical element position adjusting mechanism mounted on the exposure apparatus shown in FIG. 1. The optical element position adjusting mechanism is mounted to the terminating face of the optical lens barrel 10 facing the wafer 108 shown in FIG. 1. The optical element position adjusting mechanism includes an optical element 1 and a holding member 2 that holds the outer periphery of the optical element 1. The optical lens barrel 10 serves as a fixing portion for pivotally fixing the holding member 2 in order to adjust the position of the optical element 1. The holding member 2 holds the outer periphery of the optical element 1 using an adhesive, a mechanical fixture, or the like. In the all embodiments described below, a description will be given assuming that the optical element 1 is a projection lens which is used during projection/transfer of the pattern in the optical system of the exposure apparatus. However, the present invention is not intended to be limiting thereto. For example, the optical element 1 may be a mirror to be used for stage control or the like.

The holding member 2 includes engagement protrusions (engagement portions) 3 to 5 that protrude from the outer periphery thereof in a radially outward direction, and pressed protrusions 6 and 7 that protrude from the positions different from the engagement protrusions 3 to 5 in a radially outward direction. By pressing the pressed protrusion 6 or 7 with the driving section 8 or 9, the optical element position adjusting mechanism according to the present embodiment drives the holding member 2 to displace the optical element 1, whereby the optical element 1 is adjusted to a predetermined position. With the aid of the aforementioned configuration and a clamping portion and a flexure, both of which are to be described below, the optical element position adjusting mechanism according to the present invention realizes highly accurate positioning of the optical element 1.

Figure 2B:
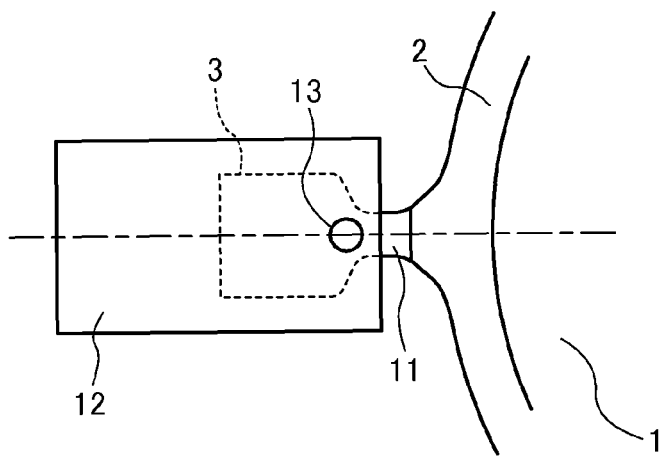
FIG. 2B is a partially enlarged diagram illustrating a clamping portion and a flexure of the optical element position adjusting mechanism according to the first embodiment of the present invention, as viewed from the above.
Figure 2C:
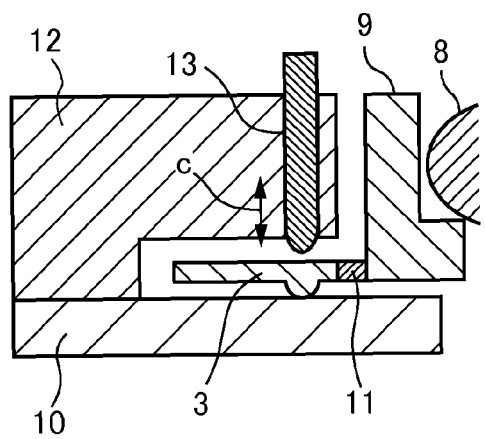
FIG. 2C is a partially enlarged diagram illustrating the clamping portion and the flexure of the optical element position adjusting mechanism according to the first embodiment of the present invention, as viewed from the side.

FIG. 2B is a partially enlarged diagram illustrating a clamping portion and the flexure, as viewed from the above. FIG. 2C is a partially enlarged diagram illustrating the clamping portion and the flexure, as viewed from the side. The engagement protrusion 3 protrudes from the outer periphery of the holding member 2 in the radially outward direction via the flexure 11. The optical lens barrel 10 includes a latch groove 12 that engages with the engagement protrusion 3, the latch groove 12 being spaced from the engagement protrusion 3 such that they do not come in contact with each other. When the engagement protrusion 3 and the latch groove 12 are locked by a clamping portion 13, the holding member 2 is fixed to the optical lens barrel 10. When the pressed protrusion 6 or 7 is pushed with the driving section 8 or the driving section 9, the flexure 11 elastically deforms to guide the holding member 2 in the pivot direction about the clamping portion 13 fixed to the optical lens barrel 10. In the present embodiment, the driving section 8 or 9 is adapted to drive the holding member 2 by pushing it in the tangential direction of the holding member 2. As described above, the clamping portion 13 is capable of fixing and releasing the holding member 2 with respect to the optical lens barrel 10. Specifically, the clamping portion 13 freely moves in the ON/OFF direction c in order to tighten or release the holding member 2 with the optical lens barrel 10, whereby the fixing and releasing of the holding member 2 may be freely performed.

Although a description has been given in the present embodiment of the case where the flexure 11 is interposed between the engagement protrusion 3 and the holding member 2, the present invention is not intended to be limiting thereto. Specifically, since the flexure 11 is to be interposed between the holding member 2 and the clamping portion 13, for example, the flexure 11 may be provided in the latch groove 12 disposed at the optical lens barrel 10 side. Also, in FIGS. 2B and 2C, while a description has been made of the configurations of the flexure 11, the latch groove 12, and the clamping portion 13 with respect to the engagement protrusion 3, the engagement protrusions 4 and 5 have the same configuration as that of the engagement protrusion 3. Furthermore, in the present embodiment, while three engagement protrusions 3 to 5 and two pressed protrusions 6 and 7 are alternately arrayed in the circumferential direction of the holding member 2 in a plural manner, the arrangement and number thereof are not intended to be limiting thereto.

Figure 3A:
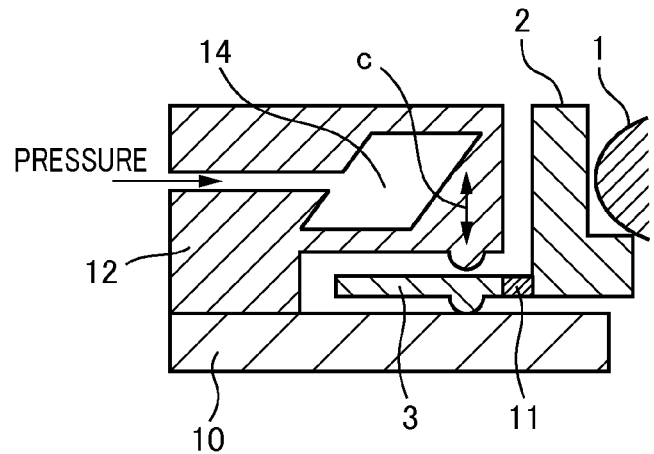
FIG. 3A is a sectional diagram illustrating a first variant example of a clamping portion according to the first embodiment of the present invention.

FIG. 3A is a sectional diagram illustrating a first variant example of a clamping portion according to the present embodiment. The clamping portion shown in FIG. 3A includes a pressure chamber 14. The pressure chamber 14 is connected to an air compressor portion (not shown) via a pipe, whereby any clamping force may be applied thereto. By changing the pressure (the pressure to be applied in the pressure direction in FIG. 3A) to be applied within the pressure chamber 14, the clamping portion may be moved in the ON/OFF direction c. When the pressure is favorably adjusted, the clamping force may be adjusted with high accuracy. Since the air compressor portion may be disposed in any position depending on piping path, there is an advantage in that space saving in the vicinity of the optical element 1 may be achieved and the effect of heat on the optical element 1 may be reduced. While in the example in FIG. 3A, the shape of the cross-section of the pressure chamber 14 is a diamond, the shape may be any other shape as long as the pressure chamber 14 is shaped to allow the clamping portion to move in the ON/OFF direction c, and the present invention is not intended to be limiting thereto.

Figure 3B:
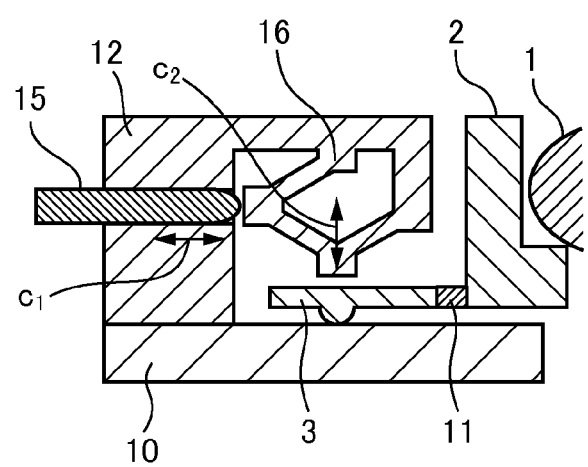
FIG. 3B is a sectional diagram illustrating a second variant example of a clamping portion according to the first embodiment of the present invention.

FIG. 3B is a sectional diagram illustrating a second variant example of a clamping portion according to the present embodiment. The clamping portion shown in FIG. 3B includes a direction changing mechanism 16. The direction changing mechanism 16 has the function of changing the ON/OFF direction c1 of the clamping portion 15 to the conversion direction c2, whereby the placement of the clamping portion 15 and the ON/OFF direction c1 may be set arbitrarily. Placing the clamping portion 15 in an empty space has an advantage in that overall space saving and good maintainability may be readily achieved. Also, applying a scaling function to the direction changing mechanism 16 has an advantage in that the clamping force may be readily adjusted arbitrarily. Specific configuring means of the direction changing mechanism 16, for example, includes a link mechanism with an elastic hinge, a gear wheel, a hydraulic mechanism, and the like.

Figure 3C:
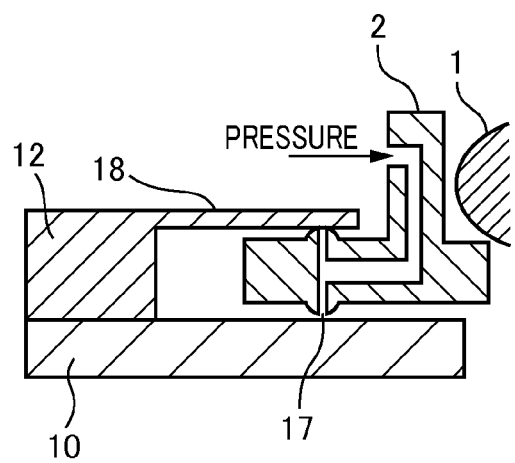
FIG. 3C is a sectional diagram illustrating a third variant example of a clamping portion according to the first embodiment of the present invention.

FIG. 3C is a sectional diagram illustrating a third variant example of a clamping portion according to the present embodiment. The clamping portion shown in FIG. 3C includes an air ejection opening 17. In FIG. 3C, the clamping portion is pushed from above by a plate spring portion 18. The plate spring portion 18 is caused to float in the air, which has an advantage in that the frictional force of the clamping portion may become substantially zero. Examples of the driving section and the clamping portion according to the embodiment of the present invention include a combination of a screw or a ball screw with a rotation-type actuator, an impact drive-type actuator, a driving section using ultrasonic vibration, and the like.

Figure 4:
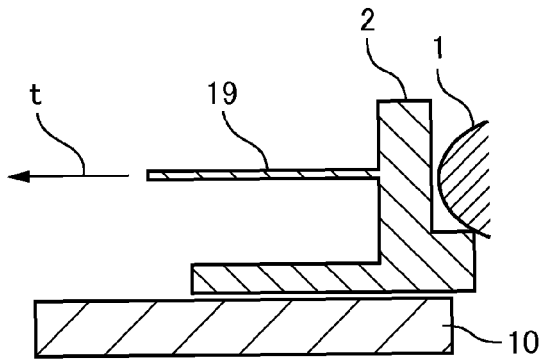
FIG. 4 is a sectional diagram illustrating a variant example of a driving section according to the first embodiment of the present invention.

FIG. 4 is a sectional diagram illustrating a variant example of a driving section according to the present embodiment. The driving section shown in FIG. 4 drives the holding member 2 with a tension t via a tension transmission portion 19. The tension transmission portion 19 is connected to the holding member 2. The driving section is driven with the tension t, whereby a rotation movement relative to the driving direction becomes less likely to occur. Consequently, the stability is increased and a more highly accurate positioning may be achieved. Specific examples of the tension transmission portion 19 include a thread composed of an organic substance, a metal wire, a spring, a carbon fiber, and the like. A metal plate spring may also be used if it may hold sufficient softness.

It should be noted that the variant examples of the clamping portion described in FIGS. 3A, 3B, and 3C, and the variant example of the driving section described in FIG. 4 may also be applicable to the optical element position adjusting mechanism of second and third embodiments to be described below.

Figure 5:
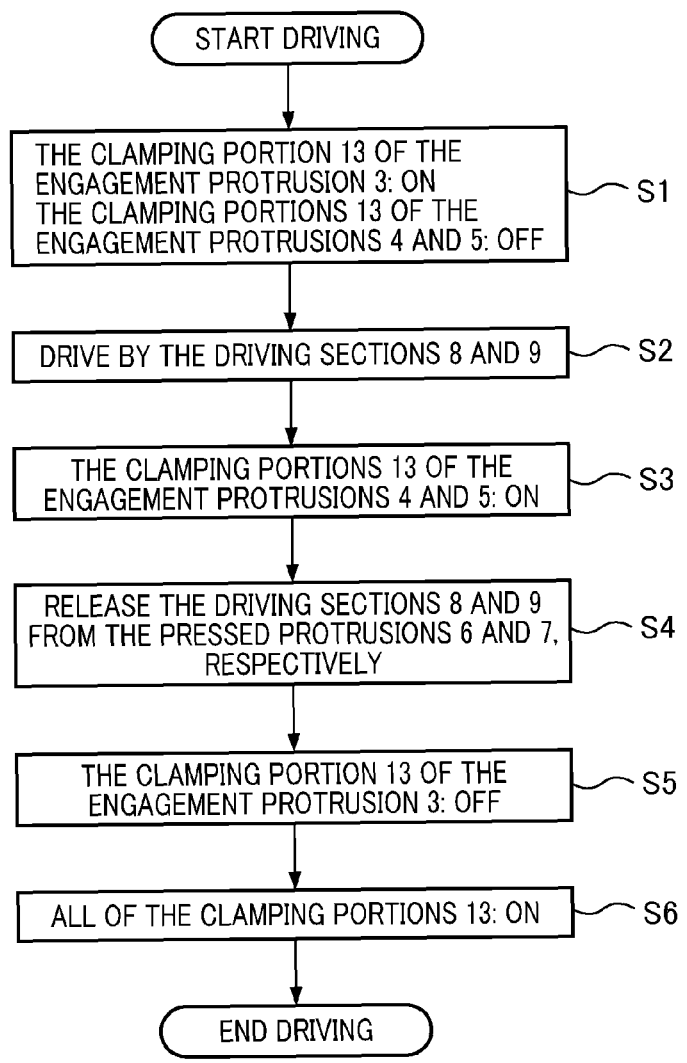
FIG. 5 is a flowchart illustrating an optical element position adjusting method according to the first embodiment of the present invention.

Hereinafter, by using the flowchart shown in FIG. 5, an optical element position adjusting method according to the present embodiment will now be described with reference to FIGS. 2A, 2B, and 2C. FIG. 5 shows a flowchart illustrating the procedure in the case where the holding member 2 is fixed to the optical lens barrel 10 using the clamping portion 13 to thereby pivot the holding member 2 about the clamping portion 13 using the flexure 11 as guide.

First, the clamping force of the clamping portion 13 of the engagement protrusion 3 is turned ON, while the clamping force of any other clamping portion than this particular clamping portion, i.e., the clamping portions 13 (not shown) of the engagement protrusions 4 and 5, is turned OFF (step S1). Next, the pressed protrusions 6 and 7 are pushed in the tangential direction d of the holding member 2 using the driving sections 8 and 9, respectively, to thereby drive the holding member 2 (step S2). The holding member 2 pivots about the clamping portion 13 with its clamping force being turned ON. Consequently, the holding member 2 provides movement like that shown in the pivot direction r. Specifically, by pushing the pressed protrusions 6 and 7 in the tangential direction d with the clamping force of the clamping portion 13 being turned ON, pressure, which elastically deforms the flexure 11, is transmitted to the flexure 11, whereby the holding member 2 moves in the pivot direction r using the flexure 11 as guide. Highly accurate positioning may be achieved by using the flexure 11 as guide. As described above, in the present embodiment, since the optical element 1 is a projection lens to be used in the optical system of the exposure apparatus, the pivot direction r is any direction perpendicular to the optical axis of the optical element 1.

When the optical element 1 is positioned at a predetermined position by causing the holding member 2 to pivot in the pivot direction r, the clamping force of the clamping portions 13 of the engagement protrusions 4 and 5 is turned ON (step S3), and thereby the driving sections 8 and 9 are released from the pressed protrusions 6 and 7, respectively (step S4). While the driving sections 8 and 9 are released from the pressed protrusions 6 and 7, respectively, in step S4, they may be pushed towards each other. It is preferred, however, that the driving sections 8 and 9 be released from the pressed protrusions 6 and 7, respectively, as shown in step S4 in order to avoid the effects of variations in temperature or the like of the driving sections 8 and 9.

Passing through the process of step S4 (or without passing through the process of step S4), the clamping force of the clamping portion 13 of the engagement protrusion 3 is turned OFF (step S5). At this time, the clamping force of the clamping portions 13 of the engagement protrusions 4 and 5 remains ON. In the process of step S5, the clamping force of the clamping portion 13 of the engagement protrusion 3, i.e., the clamping portion 13 at the center of the pivot is turned OFF, whereby the flexure 11 is restored to the state prior to being elastically deformed.

The clamping portion 13, of which the clamping force has been turned OFF in the process of step S5, is again turned ON, whereby the clamping force of all of the clamping portions 13 is turned ON (step S6), and the driving is terminated.

It should be noted that only the clamping portion 13 at the center of the pivot may provide the effects described above. However, it is preferred that a plurality of the clamping portions 13 be provided in order to increase the frictional force to be generated on the clamping portion 13 and to maintain high stability against external impact and the like. For example, three clamping portions 13 for locking at least three engagement protrusions 3 to 5 may be provided as in the present embodiment. With this arrangement, the aforementioned effects may be provided by the small number of parts.

By turning the clamping portion 13 ON/OFF repeatedly after the completion of the driving, an effect that the contact area may increase by deforming and flattening the surface irregularities of the parts in contact with the holding member 2, resulting in an increase in stability as well as positional repeatability can be expected. Furthermore, even when the optical element 1 is assembled with the distortion being applied, by turning the clamping portion 13 ON/OFF repeatedly, an effect that the distortion of the optical element 1 during assembly is gradually removed, resulting in an increase in stability, can also be expected.

It should be noted that the clamping portion 13 at the center of the pivot is freely interchanged among the plurality of the clamping portions 13 and, furthermore, is driven in combination with at least two or more pressed protrusions, whereby the holding member may be driven in any pivot direction.

Second Embodiment

Figure 6:
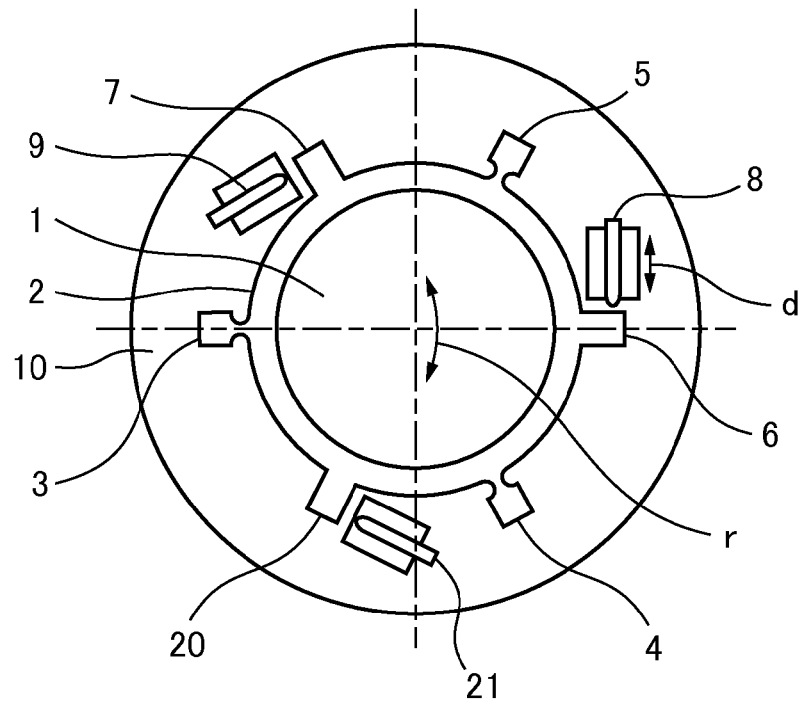
FIG. 6 is a top plan view illustrating an optical element position adjusting mechanism according to a second embodiment of the present invention.

FIG. 6 is a top plan view illustrating an optical element position adjusting mechanism according to a second embodiment of the present invention. Each of the engagement protrusions 3 to 5 and the pressed protrusions 6, 7, and 20 is provided at a position facing the radial direction of the outer periphery of the holding member 2. The holding member 2 is driven by the similar procedure as that shown in FIG. 5, and thereby the similar effects as that in the first embodiment may be provided. In comparison to the first embodiment, since the pressed protrusions are provided facing the engagement protrusions 3 to 5, the pressed protrusion 20 is added. With the aforementioned facing arrangement, for example, the pivot direction r substantially corresponds to the tangential direction d in the case where the clamping portion 13 (not shown) of the engagement protrusion 3 is fixed to thereby push the pressed protrusion 6 by the driving section 8. Hence, the force imposed on the pressed protrusion 6 in directions other than the tangential direction d can be reduced, whereby more highly accurate positioning can be achieved.

Third Embodiment

Figure 7:
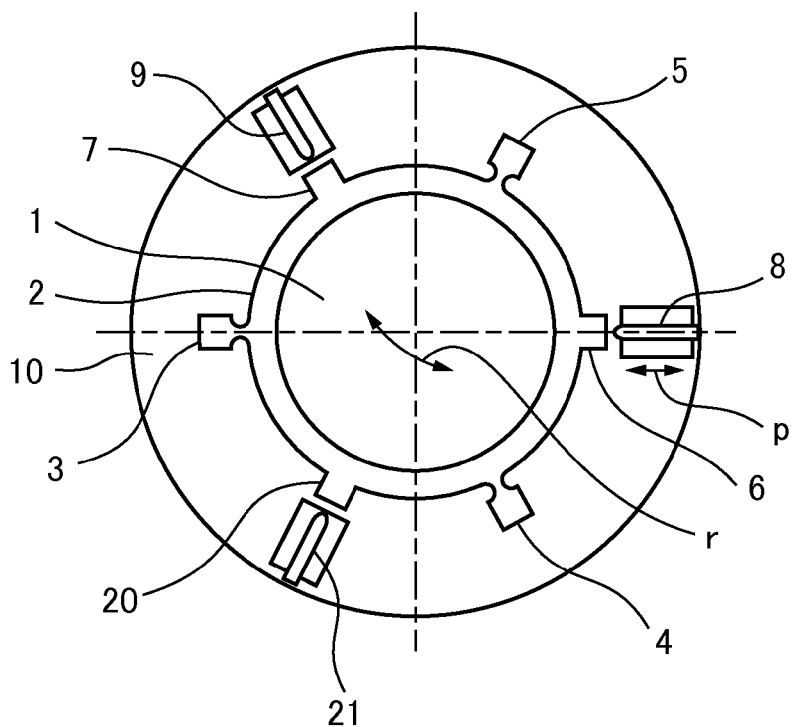
FIG. 7 is a top plan view illustrating an optical element position adjusting mechanism according to a third embodiment of the present invention.

FIG. 7 is a top plan view illustrating an optical element position adjusting mechanism according to a third embodiment of the present invention. The arrangement of the engagement protrusions 3 to 5 and the pressed protrusions 6, 7, and 20 is the same as that shown in FIG. 6. The driving sections 8, 9, and 21 are provided such that they push the pressed protrusions 6, 7, and 20 from the radial direction p of the outer periphery of the holding member 2 towards the center thereof.

Figure 8A:
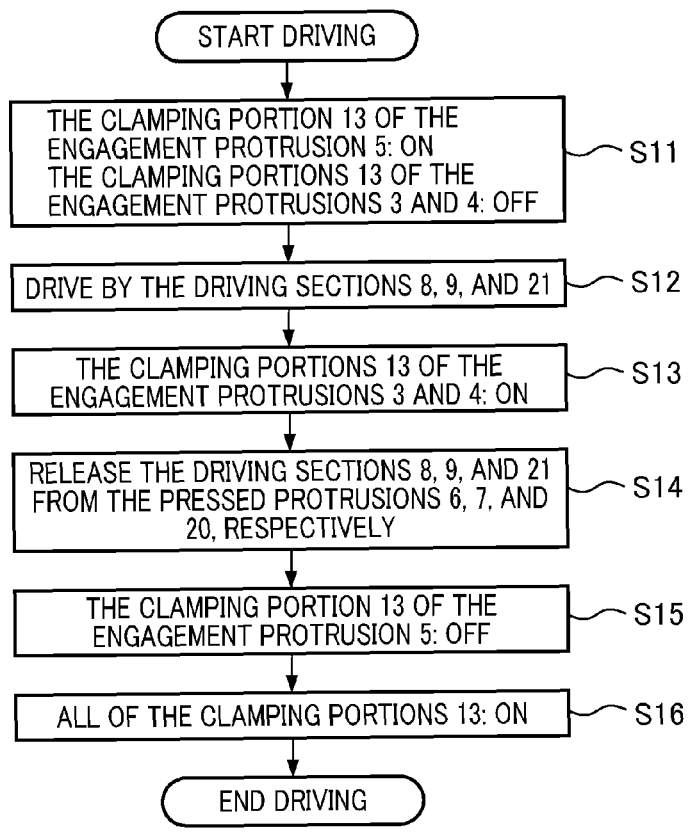
FIG. 8A is a flowchart illustrating an optical element position adjusting method (a method for driving an optical element) according to the third embodiment of the present invention.
Figure 8B:
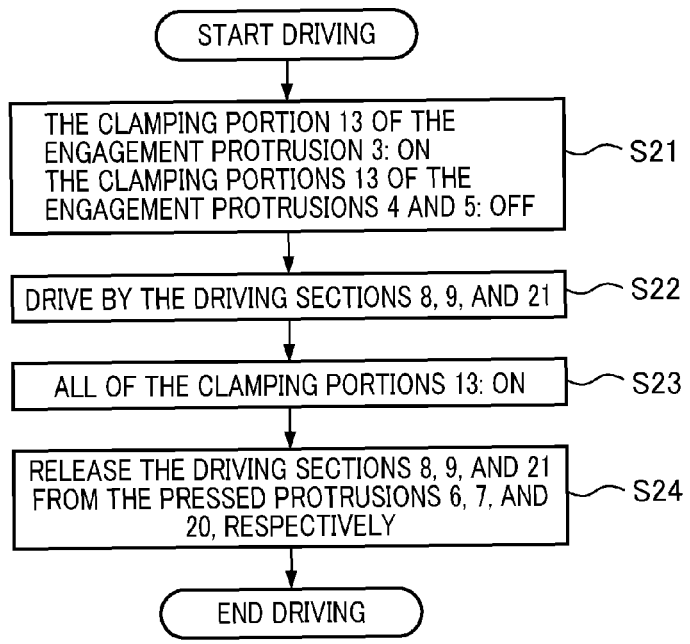
FIG. 8B is a flowchart illustrating an optical element position adjusting method (a method for deforming an optical element) according to the third embodiment of the present invention.

FIG. 8A is a flowchart illustrating an optical element position adjusting method (a method for driving an optical element) according to the present embodiment. FIG. 8B is a flowchart illustrating an optical element position adjusting method (a method for deforming an optical element) according to the present embodiment.

The specific effects obtained by the method to be described in FIG. 8A are substantially the same as those obtained by the method described in FIG. 5. Hence, a brief description will be given hereinafter of the procedure in FIG. 8A, and a description of the specific effects will be omitted. The clamping force of the clamping portion 13 of the engagement protrusion 5 is turned ON, while the clamping force of the clamping portions 13 of the engagement protrusions 3 and 4 is turned OFF (step S11). Next, the pressed protrusions 6, 7, and 20 are pushed from the radial direction p of the outer periphery of the holding member 2 towards the center thereof using the driving sections 8, 9, and 21, respectively, to thereby drive the holding member 2 (step S12). The clamping force of the clamping portions 13 of the engagement protrusions 3 and 4 is turned ON (step S13), and then the driving sections 8, 9, and 21 are released from the pressed protrusions 6, 7, and 20, respectively (step S14). The process of step S14 is selective, as in the process of step S4 shown in FIG. 5. The clamping force of the clamping portion 13 of the engagement protrusion 5 is turned OFF (step S15). At this time, the clamping force of the clamping portions 13 of the engagement protrusions 3 and 4 remains ON. The clamping portion 13, of which the clamping force has been turned OFF in the process of step S15, is again turned ON, whereby the clamping force of all of the clamping portions 13 is turned ON (step S16), and the driving is terminated.

As described above, FIG. 8B shows a method for deforming the optical element 1, i.e., a method for adjusting the optical element 1 by producing 2θ deformation that helps decreasing the aberration of the optical element 1. In the process shown in FIG. 8B, first, the clamping force of the clamping portion 13 of the engagement protrusion 3 is turned ON, while the clamping force of the clamping portions 13 of the engagement protrusions 4 and 5 is turned OFF (step S21). Next, the pressed protrusions 6, 7, and 20 are pushed by the driving sections 8, 9, and 21, respectively, to thereby drive the holding member 2 (step S22). The clamping force of all of the clamping portions 13 is turned ON (step S23), whereby the driving sections 8, 9, and 21 are released from the pressed protrusions 6, 7, and 20, respectively (step S24) and the driving is terminated. According to the optical element position adjusting mechanism of the present embodiment, the adjustment for the driving and deformation of a single optical element 1 can be made by performing the procedure in FIG. 8B following the procedure in FIG. 8A.

(Device Manufacturing Method)

Next, a method of manufacturing a device (semiconductor device, liquid crystal display device, etc.) as an embodiment of the present invention is described. The semiconductor device is manufactured through a front-end process in which an integrated circuit is formed on a wafer, and a back-end process in which an integrated circuit chip is completed as a product from the integrated circuit on the wafer formed in the front-end process. The front-end process includes a step of exposing a wafer coated with a photoresist to light using the above-described exposure apparatus of the present invention, and a step of developing the exposed wafer. The back-end process includes an assembly step (dicing and bonding), and a packaging step (sealing). The liquid crystal display device is manufactured through a process in which transparent electrodes are formed. The process of forming a plurality of transparent electrodes includes a step of coating a glass substrate with a transparent conductive film having a photoresist deposited thereon, a step of exposing the glass substrate coated with the photoresist to light using the above-described exposure apparatus, and a step of developing the exposed glass substrate. The device manufacturing method of this embodiment has an advantage, as compared with a conventional device manufacturing method, in at least one of performance, quality, productivity and production cost of a device.

While the embodiments of the present invention have been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-121891 filed May 20, 2009 which is hereby incorporated by reference herein in its entirety.

What is claimed is:

1. An adjusting mechanism configured to adjust a position of an optical element, comprising:
    a fixing portion;
    a holding member configured to hold the optical element, the holding member including an outer periphery portion configured to hold an outer periphery of the optical element, a plurality of engagement protrusions configured to be connected to the outer periphery portion and to protrude in a radially outward direction of the optical element, and a plurality of flexures configured to be connected to the engagement protrusions and the outer periphery portion;
    a plurality of clamping portions capable of fixing or releasing the engagement protrusions with respect to the fixing portion; and
    a driving section configured to drive the outer periphery portion of the holding member in a pivot direction about a clamping portion fixing an engagement protrusion,
    wherein a clamping portion at a center of a pivot is configured to release an engagement protrusion so as to restore a flexure to a state prior to being elastically deformed in a state where a clamping portion other than the clamping portion at the center of the pivot fixes an engagement protrusion, and wherein the clamping portion at the center of the pivot is configured to fix the engagement protrusion again in a state where the flexure is restored to the state prior to being elastically deformed.

2. The adjusting mechanism according to claim 1, wherein the fixing portion includes a member having a groove, and wherein the clamping portion at the center of the pivot is configured to fix the engagement protrusion within the groove.

3. The adjusting mechanism according to claim 2, wherein the holding member includes a pressed protrusion configured to be connected to the outer periphery portion and to protrude in a radially outward direction of the optical element.

4. The adjusting mechanism according to claim 3, wherein a plurality of pressed protrusions are provided, and a plurality of the engagement protrusions and the pressed protrusions are alternately arrayed in a circumferential direction of the holding member.

5. The adjusting mechanism according to claim 4, wherein at least three of the engagement protrusions and at least two of the pressed protrusions are provided.

6. The adjusting mechanism according to claim 3, wherein the pressed protrusion is provided at a position opposed in the radial direction with respect to the engagement protrusion.

7. The adjusting mechanism according to claim 3, wherein a pressed direction of the driving section is the radial direction or the outer periphery direction of the holding member.

8. An exposure apparatus including an optical lens barrel and an adjusting mechanism configured to adjust a position of an optical element, the adjusting mechanism comprising:
  a holding member for holding the optical element, the holding member including an outer periphery portion configured to hold an outer periphery of the optical element, a plurality of engagement protrusions configured to be connected to the outer periphery portion and to protrude in a radially outward direction of the optical element, and a plurality of flexures configured to be connected to the engagement protrusions and the outer periphery portion;
  a plurality of clamping portions capable of fixing or releasing the engagement protrusions with respect to the optical lens barrel;
  a driving section configured to drive the outer periphery portion of the holding member in a pivot direction about a clamping portion fixing an engagement protrusion,
wherein a clamping portion at a center of a pivot is configured to release an engagement protrusion so as to restore a flexure to a state prior to being elastically deformed in a state where a clamping portion other than the clamping portion at the center of the pivot fixes an engagement protrusion, and
wherein the clamping portion at the center of the pivot is configured to fix the engagement protrusion again in a state where the flexure is restored to the state prior to being elastically deformed.

9. A device manufacturing method comprising:
exposing a wafer using an exposure apparatus comprising an optical lens barrel and an adjusting mechanism configured to adjust a position of an optical element; and
developing the wafer,
wherein the adjusting mechanism comprises:
  a holding member configured to hold the optical element, the holding member including an outer periphery portion configured to hold an outer periphery of the optical element, a plurality of engagement protrusions configured to be connected to the outer periphery portion and to protrude in a radially outward direction of the optical element, and a plurality of flexures configured to be connected to the engagement protrusions and the outer periphery portion;
  a plurality of clamping portions capable of fixing or releasing the engagement protrusions with respect to the optical lens barrel; and
  a driving section configured to drive the outer periphery portion of the holding member in a pivot direction about a clamping portion fixing an engagement protrusion,
wherein a clamping portion at a center of a pivot is configured to release an engagement protrusion so as to restore a flexure to a state prior to being elastically deformed in a state where a clamping portion other than the clamping portion at the center of the pivot fixes an engagement protrusion, and
wherein the clamping portion at the center of the pivot is configured to fix the engagement protrusion again in a state where the flexure is restored to the state prior to being elastically deformed.

* * * * *